United States Patent
Jann et al.

(10) Patent No.: US 9,536,814 B2
(45) Date of Patent: Jan. 3, 2017

(54) DIE STACKING APPARATUS AND METHOD

(71) Applicant: Taiwan Semiconductor Manufacturing Co., Ltd, Hsin-Chu (TW)

(72) Inventors: Larry Jann, Taipei (TW); Chih-Chien Chang, Jhuangwei Township (TW); Po-Wen Chuang, Jhubei (TW); Ming-I Chiu, Hsinchu (TW); Chang-Hsi Lin, Hsinchu (TW); Chih-Chan Li, Taichung (TW); Yi-Ting Hu, Budai Townahip (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 273 days.

(21) Appl. No.: 14/187,644

(22) Filed: Feb. 24, 2014

(65) Prior Publication Data

US 2015/0243630 A1 Aug. 27, 2015

(51) Int. Cl.
*G06F 17/50* (2006.01)
*H01L 23/498* (2006.01)
*H01L 25/00* (2006.01)
*H01L 21/67* (2006.01)
*H01L 21/677* (2006.01)

(52) U.S. Cl.
CPC ....... *H01L 23/498* (2013.01); *H01L 21/67294* (2013.01); *H01L 21/67778* (2013.01); *H01L 25/50* (2013.01); *H01L 2924/0002* (2013.01)

(58) Field of Classification Search
CPC ... G06F 7/705; G06F 17/5068; G06F 22/1712
USPC .......... 716/55, 100, 105, 110, 119, 137; 438/106–107, 113, 118, 122, 124, 126, 438/164; 257/774, 680
See application file for complete search history.

(56) References Cited

U.S. PATENT DOCUMENTS

| | | | | |
|---|---|---|---|---|
| 8,601,430 B1 * | 12/2013 | Shroff | ................ | G06F 17/5081 716/100 |
| 8,627,266 B2 * | 1/2014 | Lee | ........................ | H01L 22/20 716/137 |
| 2013/0122659 A1 * | 5/2013 | Wu | ................... | H01L 23/49827 438/126 |

FOREIGN PATENT DOCUMENTS

| TW | 200616178 | 5/2006 |
|---|---|---|
| TW | 201338076 | 9/2013 |

* cited by examiner

*Primary Examiner* — Paul Dinh
(74) *Attorney, Agent, or Firm* — Birch, Stewart, Kolasch & Birch, LLP (57) ABSTRACT

Embodiments of a die stacking apparatus are provided. The die stacking apparatus includes a storage device configured to contain a top wafer and an interposer wafer. The top wafer has a number of top dies, and the interposer wafer has a number of interposer dies. The die stacking apparatus also includes a carrier device configured to carry the interposer wafer, and a transferring device configured to transfer the interposer wafer to the carrier device and to dispose the top dies on the interposer dies. The die stacking apparatus further includes a process module configured to control the transferring device. The process module controls the transferring device to transfer the interposer wafer to the carrier device, and controls the transferring device to dispose the top dies on the interposer dies of the interposer wafer, which is stacked on the carrier device.

20 Claims, 10 Drawing Sheets

DIE STACKING APPARATUS AND METHOD

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

Recently, a 3D chip stacking technology has been developed. In the 3D chip stacking technology, a number of chips are stacked to form a functional chip, such as a central processing unit (CPU). Although existing devices and methods for 3D chip stacking technology have been generally adequate for their intended purposes, they have not been entirely satisfactory in all respects. Consequently, it would be desirable to provide a solution for improving the 3D chip stacking technology.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
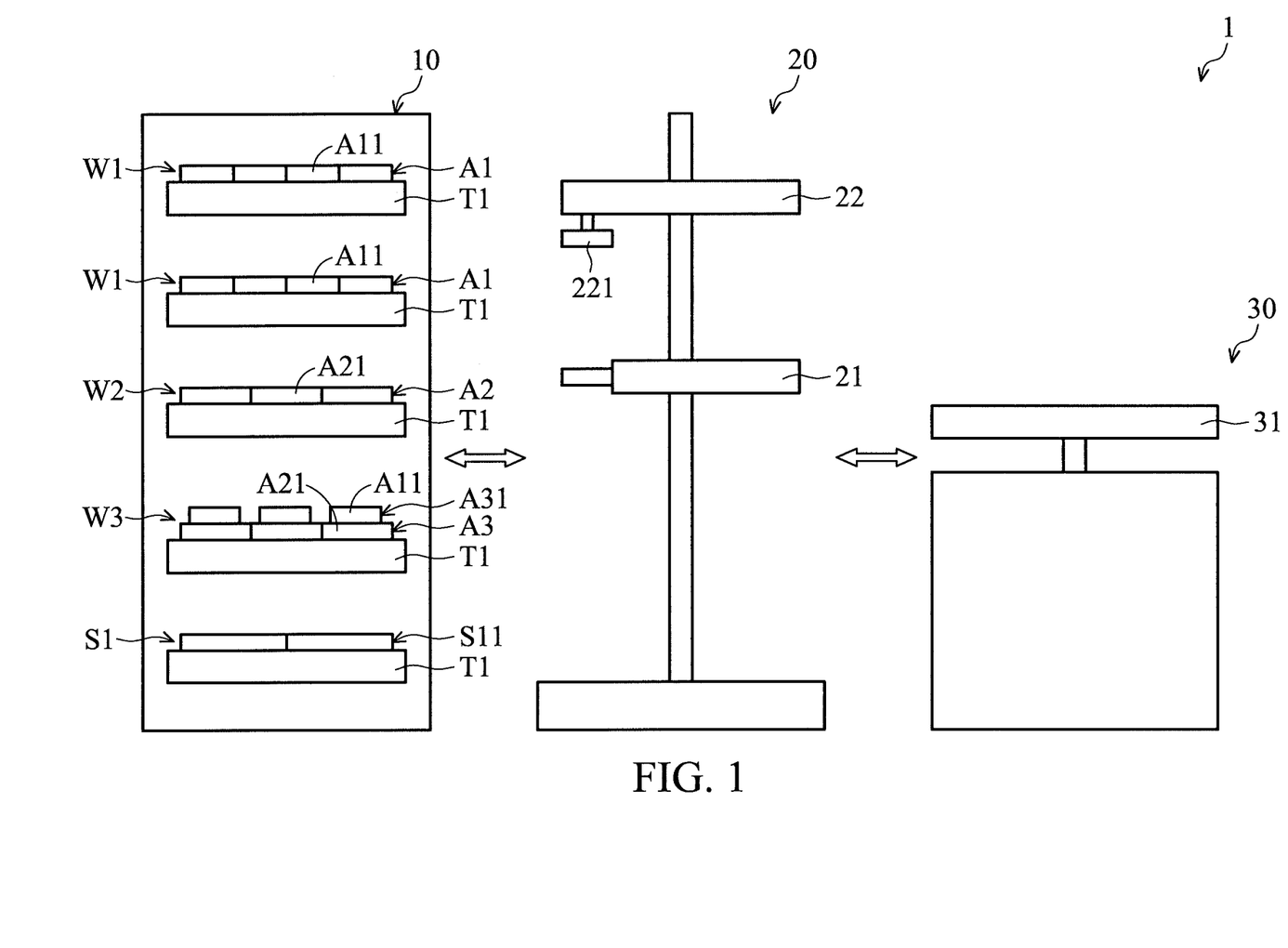
FIG. 1 is a schematic view of a die stacking apparatus in accordance with some embodiments of the disclosure.

Embodiments of a die stacking apparatus and method are provided. The die stacking apparatus is configured to stacking a number of dies to form a functional chip, such as a CPU. In some embodiments, the functional chip by stacking a number of dies is a 3D stacking chip. FIG. 1 is a schematic view of a die stacking apparatus 1 in accordance with some embodiments of the disclosure. The die stacking apparatus 1 includes a storage device 10, a transferring device 20, and a carrier device 30.

The storage device 10 is configured to contain a number of top wafers W1, interposer wafers W2, stacked wafers W3, substrate arrays S1, and trays T1. Each of the top wafers W1, the interposer wafers W2, the stacked wafers W3, and the substrate arrays S1 is disposed on one of the trays T1. In some embodiments, the storage device 10 further includes a number of containers (not shown in the figures). The top wafers W1 are received in one of the containers. The interposer wafers W2 are received in one of the containers. The stacked wafers W3 are received in one of the containers. The substrate arrays S1 are received in one of the containers.

The transferring device 20 is configured to transfer one of the top wafers W1, the interposer wafers W2, the stacked wafers W3, and the substrate arrays S1 to the carrier device 30. The carrier device 30 is configured to carry the interposer wafers W2 or the substrate arrays S1 with the trays T1. In some embodiments, the carrier device 30 includes a carry plate 31.

In some embodiments, the transferring device 20 further includes a first transferring arm 21 and a second transferring arm 22. The first transferring arm 21 is configured to transfer one of the interposer wafers W2, the stacked wafers W3, and the substrate arrays S1 with the tray 21 from the storage device 10 to the carry plate 31. In some embodiments, the first transferring arm 21 holds the tray 21 during a transferring process.

The second transferring arm 22 is configured to transfer a die (such as a top die A11 or a stacked die A31 as shown in FIG. 1) from the storage device 10 to the interposer wafer W2 or the substrate array S1, which is disposed on the carry plate 31. In some embodiments, the second transferring arm 22 holds the die with a suction cup 221 during the transferring process.

In some embodiments, the top wafers W1, the interposer wafers W2, and the substrate arrays Si are cut into several parts. Each of the top wafers W1 includes a top die array A1. Each of the top die arrays A1 includes a number of top dies A11. In other words, the top dies A11 are arranged on the tray T1 in an array. Each of the interposer wafers W2 includes an interposer die array A2. Each of the interposer die arrays A2 includes a number of interposer dies A21. In other words, the interposer dies A21 are arranged on the tray T1 in an array. In some embodiments, the top dies A11, the interposer dies A21 are chips made by the semiconductor manufacturing process The stacked wafers W3 are formed by the interposer wafers W2 and the top dies A11 stacked on the interposer wafers W2. Each of the stacked wafers W3 includes a stacked-die array A3. Each of the stacked-die arrays A3 includes a number of stacked dies A31. The stacked dies A31 are formed by the interposer dies A21 and the top dies A11 stacked on the interposer dies A21. In other words, the stacked dies A31 are arranged on the tray T1 in an array.

Each of the substrate arrays S1 includes a number of substrates S11. In other words, the substrates S11 are arranged on the tray T1 in an array. In some embodiments, the substrates S11 are printed circuit boards.

Figure 2:
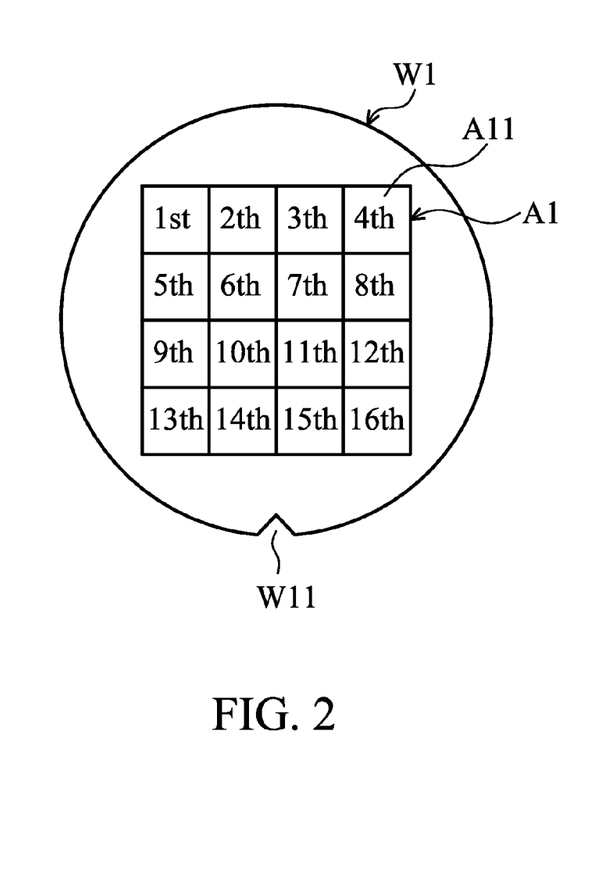
FIG. 2 is a top view of a top wafer in accordance with some embodiments of the disclosure.

FIG. 2 is a top view of the top wafer W1 in accordance with some embodiments of the disclosure. For example, as shown in FIG. 2, the top die array A1 is a 4×4 matrix, and the top die array A1 includes sixteen top dies A11. The top wafer W1 further includes a position mark W11. In some embodiments, the position mark W11 is a notch. Each of the locations of the top dies A11 is determined by detecting the position mark W11.

Figure 3:
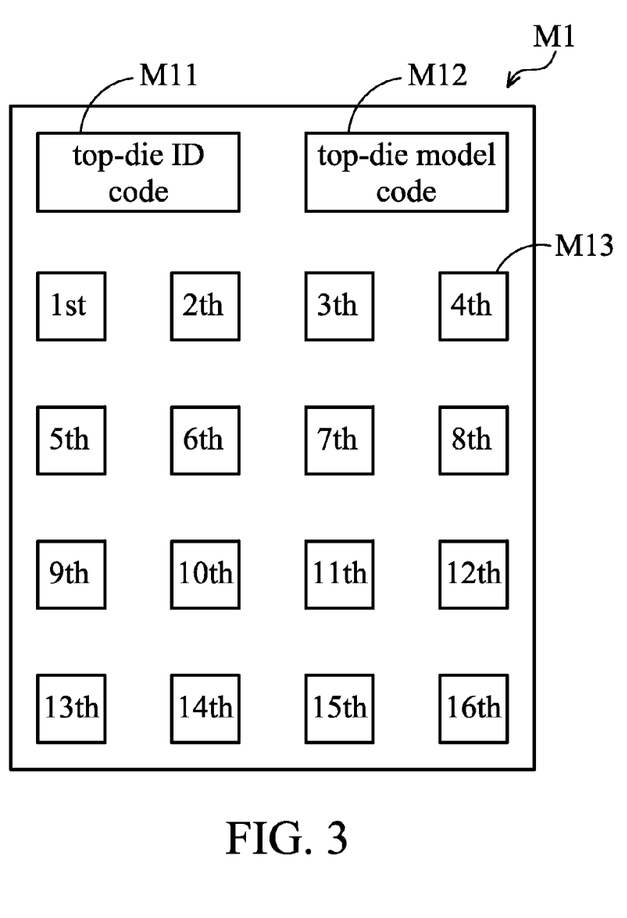
FIG. 3 is a table of a top-die mapping file in accordance with some embodiments of the disclosure.

FIG. 3 is a table of a top-die mapping file M1 in accordance with some embodiments of the disclosure. Each of the top wafers W1 corresponds to one of the top-die mapping files M1. The top-die mapping files M1 are generated according to the inspections of the top wafers W1.

In some embodiments, each of the top-die mapping files M1 includes a top-die identification (ID) code M11, a top-die model code M12, a number of top-die quality code M13. Each of the top-die ID codes M11 corresponds to one of top wafers W1 (and the top die arrays A1). In some embodiments, the top-die ID codes M11 is a wafer ID. The top-die model code M12 indicates the model of the corresponding top wafers W1. For example, the top-die model code M12 indicates a model, such as a process part, a display part, or a memory part.

Each of the top-die quality codes M13 corresponds to one of the top dies A11 of the corresponding top wafers W1 (and the top die arrays A1). For example, the first of the top-die quality code M13 of the top-die mapping file M1 corresponds to the first of the top die A11 of the top die array A1 of the top wafer W1. In some embodiments, the top-die quality codes M13 forms a matrix.

In some embodiments, each of the top-die quality codes M13 is generated according to the inspections of each of the top dies A11. The top-die quality codes M13 indicate the quality of the corresponding top dies A11.

Each of the values of the top-die quality codes M13 indicates a quality level of the top die A11. For example, if the quality level of the top die A11 is great, then the top-die quality code M13 is 1. If the quality level of the top die A11 is normal, the top-die quality code M13 is 2. If the quality level of the top die A11 is low, the top-die quality code M13 is 3. The values, 1, 2 and 3, are defined as qualified-level values, and the corresponding top die A11 is defined as a workable die. If the top die A11 is failed (or unworkable), the top-die quality code M13 is X. The value, X, is defined as an unqualified-level value, and the corresponding top die A11 is defined as a failed die.

Figure 4:
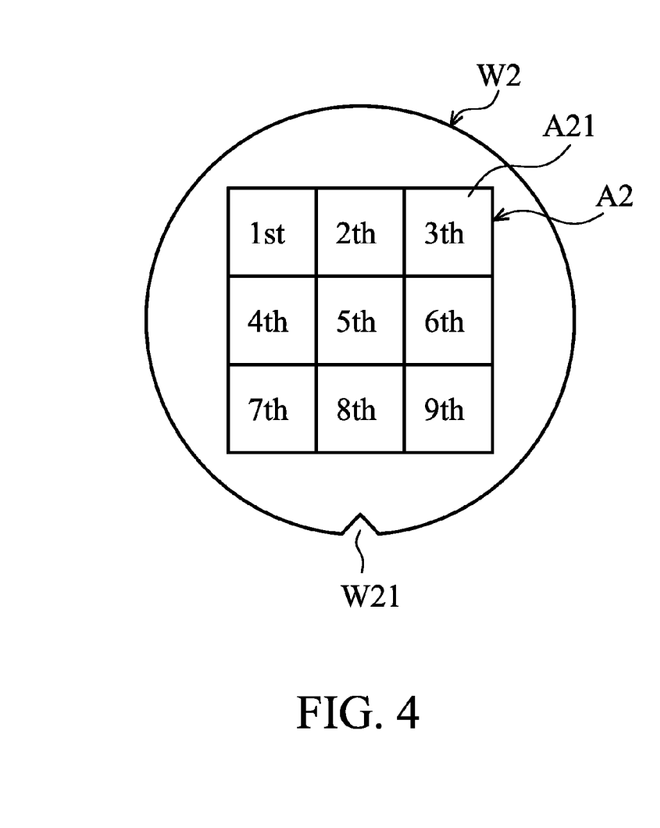
FIG. 4 is a top view of an interposer wafer in accordance with some embodiments of the disclosure.

FIG. 4 is a top view of the interposer wafer W2 in accordance with some embodiments of the disclosure. For example, as shown in FIG. 4, the interposer die array A2 is a 3×3 matrix, and the interposer die array A2 includes nine interposer dies A21. The interposer wafer W2 further includes a position mark W21, such as the position mark W11

Figure 5:
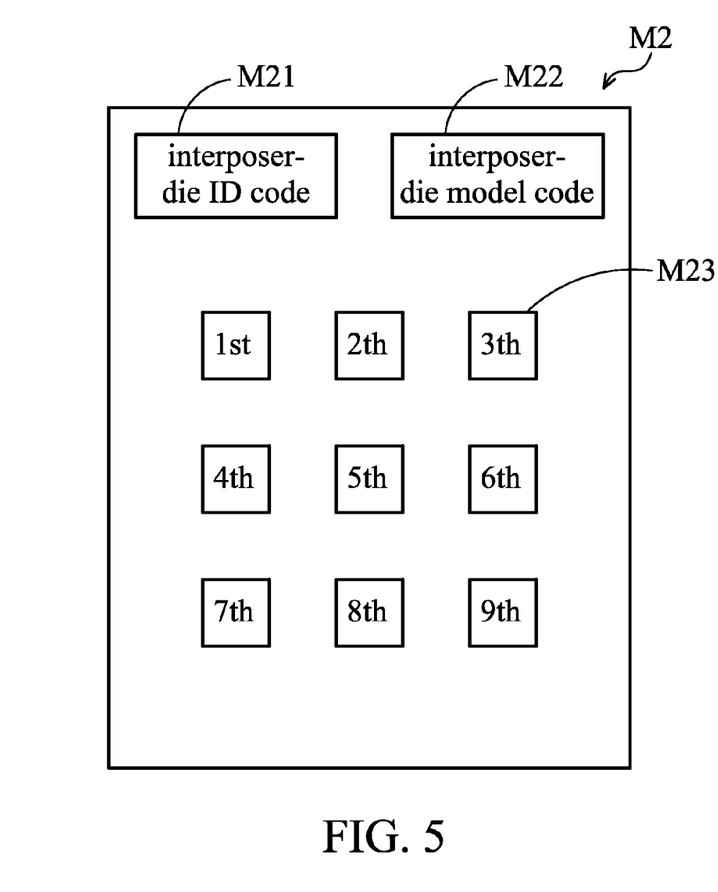
FIG. 5 is a table of an interposer-die mapping file in accordance with some embodiments of the disclosure.

FIG. 5 is a table of an interposer-die mapping file M2 in accordance with some embodiments of the disclosure. Each of the interposer wafers W2 corresponds to one of the interposer-die mapping files M2. The interposer-die mapping files M2 are generated according to the inspections of the interposer wafers W2.

In some embodiments, each of the interposer-die mapping file M2 includes an interposer-die identification (ID) code M21, an interposer-die model code M22, a number of interposer-die quality codes M23. Each of the interposer-die ID codes M21 corresponds to one of interposer wafers W2 (and the interposer die arrays A2). In some embodiments, the interposer-die ID codes M21 is a wafer ID. The interposer-die model code M22 indicates the model of the corresponding interposer wafers W2, as the top-die model code M12.

Each of the interposer-die quality codes M23 corresponds to one of the interposer dies A21 of the corresponding interposer wafers W2 (and the interposer die arrays A2). In some embodiments, the interposer-die quality codes M23 forms a matrix. Each of the values of interposer-die quality codes M23 indicates a quality level of the interposer die A21, such as the top-die quality codes M13.

Figure 6:
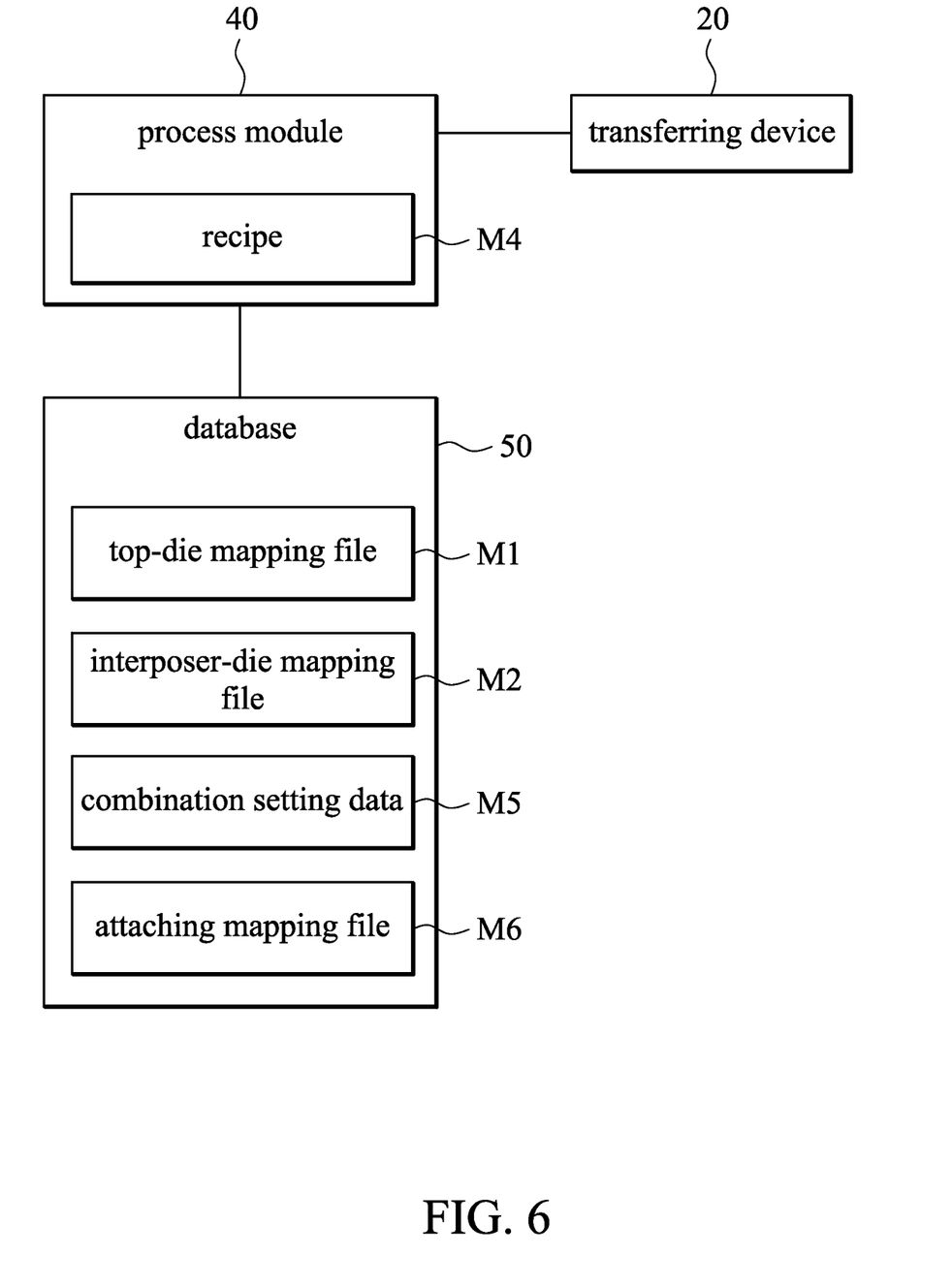
FIG. 6 is a system diagram of the die stacking apparatus in accordance with some embodiments of the disclosure.

FIG. 6 is a system diagram of the die stacking apparatus in accordance with some embodiments of the disclosure. The die stacking apparatus 1 further includes a process module 40 and a database 50. The process module 40 is coupled to the transferring device 20 and the database 50. The process module 40 is configured to control the transferring device 20 and generate an attaching mapping file M6. In some embodiments, the process module 40 is a computer. The process module 40 is coupled to the database 50 via internet or intranet. In some embodiments, the process module 40 includes a number of recipes M4.

The database 50 is configured to store the top-die mapping files M1, the interposer-die mapping file M2, and a number of combination setting data M5. In some embodiments, the database 50 is a hard disk installed in the process module 40.

Figure 7:
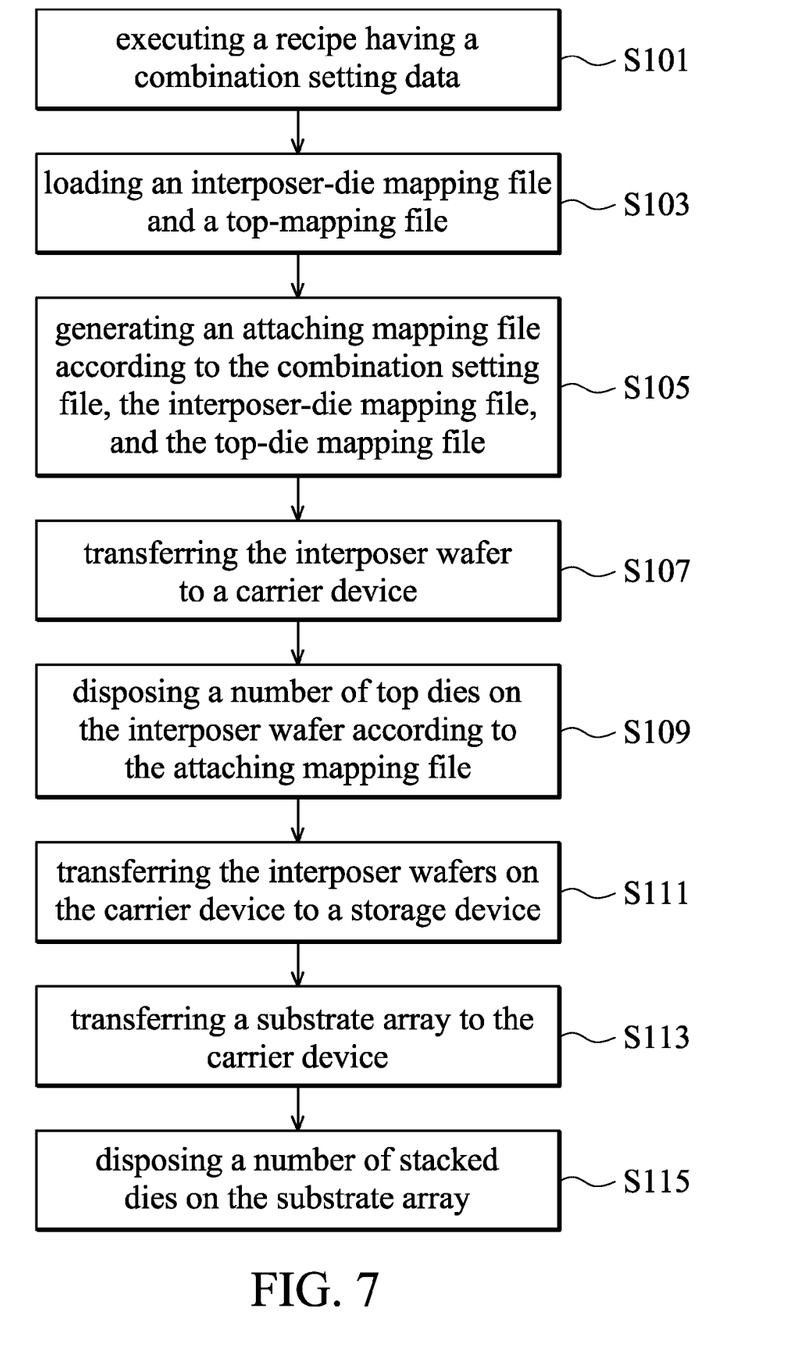
FIG. 7 is a flow chart of a die stacking method in accordance with some embodiments of the disclosure.

FIG. 7 is a flow chart of a die stacking method in accordance with some embodiments of the disclosure. The die stacking method is configured to dispose a number of top dies A11 on the interposer dies A21 of the interposer wafers W2. The die stacking method is further configured to dispose the stacked die A31, formed by the top die A11 and the interposer die A21, on the substrate array S1.

In step S101, the process module 40 loads one of the recipes M4 and executes the loaded recipe M4. In some embodiments, each of the recipes M4 corresponds to a specific product, such as a specific model of a central processing unit (CPU). In some embodiments, the recipe M4 includes a combination setting data M5, and a number of model codes, such as an interposer-die model code, at least one top-die model code, and/or a substrate model code.

Each of the model codes corresponds to a specific part of the product, such as the top die A11, the interposer die A21, the stacked die A31, or the substrate S11. In other words, one type of top die A11 corresponds to a value of the top-die model code M12. One type of interposer die A21 corresponds to a value of the interposer-die model code M22. One type of substrate S11 corresponds to a value of the substrate model code.

In step S103, the process module 40 loads one of the interposer-die mapping file M2 and at least one of the top-die mapping files M1 from the database 50 according to the loaded recipe M4. In some embodiments, the process module 40 searches the interposer-die model code of the loaded recipe M4 in the interposer-die mapping files M2 of the database 50. Afterwards, the process module 40 loads one of the interposer-die mapping files M2, which the value of the interposer-die model code M22 of the interposer-die mapping file M2 is the same as the value of the interposer-die model code of the loaded recipe M4.

The process module 40 also searches the top-die model code of the recipe M4 on the top-die mapping files M1 in the database 50. In some embodiments, the process module 40 loads one or more the top-die mapping files M1, which the value of the top-die model codes M12 of the top-die mapping files M1 is the same as the value of the top-die model code of the loaded recipe M4.

In step S105, the process module 40 generates an attaching mapping file M6 according to the top-die mapping file M1, the interposer-die mapping file M2, and the combination setting data M5 loaded by the process module 40. The loaded combination setting data M5 corresponds to the loaded interposer-die mapping file M2, and the loaded top-die mapping file M1.

In some embodiments, the loaded combination setting data M5 includes a top-die model code and an interposer-die model code. The value of the top-die model code of the loaded combination setting data M5 is the same as the value of the top-die model codes M12 of the loaded top-die mapping file M1 and the recipe M4. The value of the interposer-die model code of the loaded combination setting data M5 is the same as the value of the interposer-die model code M22 of the loaded interposer-mapping file M1 and the loaded recipe M4. In some embodiments, the loaded combination setting data M5 combines the loaded top-die mapping file M1, the loaded interposer-die mapping file M2 according to the top-die model code and the interposer-die model code.

In some embodiments, each of the combination setting data M5 further includes a number of combination settings. Each of the combination settings defines the position of the top die A11 on the interposer die A21. Furthermore, each of the combination settings define the combination of at least one of the top dies A11 and one of the interposer dies A21 according the top-die quality codes M13 and the interposer-die quality codes M23.

In some embodiments, each of the combination settings also includes a predetermined top-die quality code and a predetermined interposer-die quality. The top die A11 is stacked on interposer die A21 when the value of the top-die quality code corresponding to the top die A11 is the same as the value of the predetermined top-die quality code, and the value of the interposer-die quality code corresponding to the interposer die A21 is the same as the value of the predetermined interposer-die quality code.

For example, if the predetermined top-die quality code has a first value, and a predetermined interposer-die quality has a second value, the top-die quality code of the top die A11 stacked on the interposer die A21 has the first value, and the interposer-die quality code of the interposer die A21 has the second value according to the combination setting data M5.

In some embodiments, some of the combination settings include a number of the predetermined top-die quality codes. The top die A11 is stacked on the interposer die A21 when the value of the top-die quality code corresponding to the top die A11 is the same as one of the values of the predetermined top-die quality codes, and the value of the interposer-die quality code corresponding to the interposer die A21 is the same as the value of the predetermined interposer-die quality code.

Figure 8:
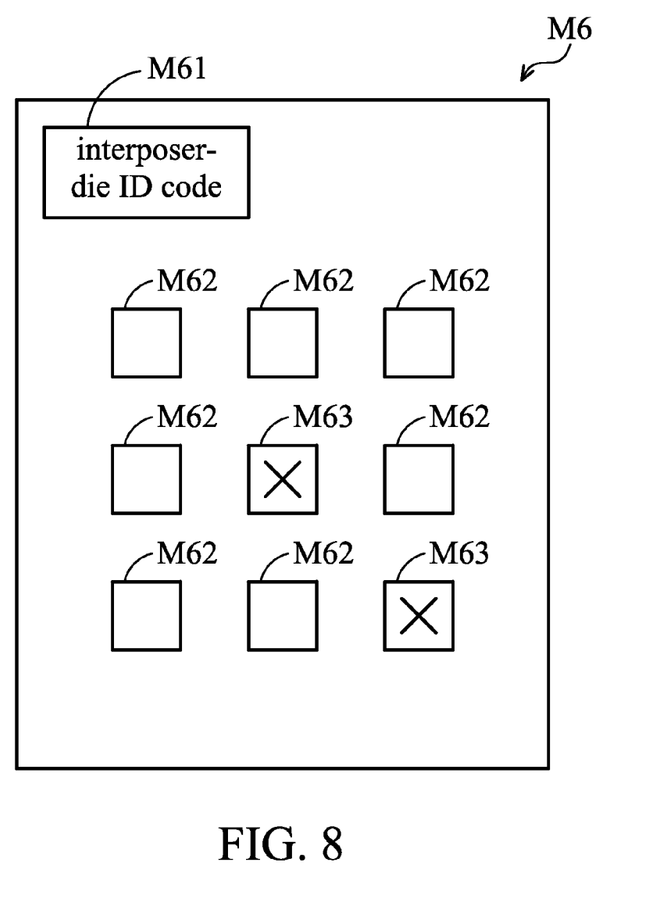
FIG. 8 is a table of the attaching mapping file in accordance with some embodiments of the disclosure.

FIG. 8 is a table of the attaching mapping file M6 in accordance with some embodiments of the disclosure. In some embodiments, the attaching mapping file M6 includes an interposer-die ID code M61. The value of the interposer-die ID code M61 is the same as the value of the interposer-die ID code M21 of the loaded interposer-die mapping file M2.

In some embodiments, the attaching mapping file M6 includes a number of the attaching data M62. Each of the attaching data M62 corresponds to one of the interposer dies A21, which corresponds to the interposer-die mapping file M2.

Each of the attaching data M62 includes a top-die ID code and a top die number. The value of the top-die ID code of the attaching data M62 is the same as the value of the top-die ID code M11 of the loaded top-die mapping files M1. The top die number corresponds to one of the top die A11 to be stacked on the interposer die A21. In some embodiments, the attaching mapping file M6 includes at least one skip code M63 when at least one interposer die A21 is failed (unworkable). In some embodiments, the number of the attaching data M62 and the skip code M63 is the same as the number of the interposer-die quality codes M23 of the interposer-die mapping file M2 and the interposer dies A21 of the interposer wafer W2.

Furthermore, in step S105, the process module 40 writes the interposer-die ID code M61 in the attaching mapping file M6 according to the interposer-die mapping file M2. Afterwards, the process module 40 writes the number of the attaching data M62 and/or the skip codes M63 in sequence.

In some embodiments, the steps of generating the attaching data M62 are described as follows. The process module 40 reads one of the interposer-die quality codes M23 from the loaded interposer-die mapping file M2. Afterwards, the process module 40 reads one predetermined interposer-die quality, which has a value the same as the interposer-die quality code M23, from the combination setting data of the loaded recipe M4. The process module 40 further reads the predetermined top-die quality code corresponding to the predetermined interposer-die quality. Afterwards, the process module 40 reads one top-die quality code M13, which has a value is the same as the value of the predetermined top-die quality code, from the loaded top-die mapping file M1. Finally, the process module 40 writes the top die number and the top-die ID code M11 according to the top-die quality code M13, read by the process module 40, to the attaching data M62. The top die number is determined according to the order of the top-die quality code M13. For example, if the top-die quality code M13 read by the process module 40 is the fourth of the top-die quality codes M13 of the top-die mapping file M1, then the value of the top die number is 4.

In some embodiments, the top die number does not correspond to the top die A11, which corresponds to the top-die quality code M13 having an unqualified-level value. Furthermore, the process module 40 writes the skip code M63 in the attaching mapping file M6, when the interposer-die quality code M23 of the interposer-die mapping file M2 has an unqualified-level value.

Figure 9A:
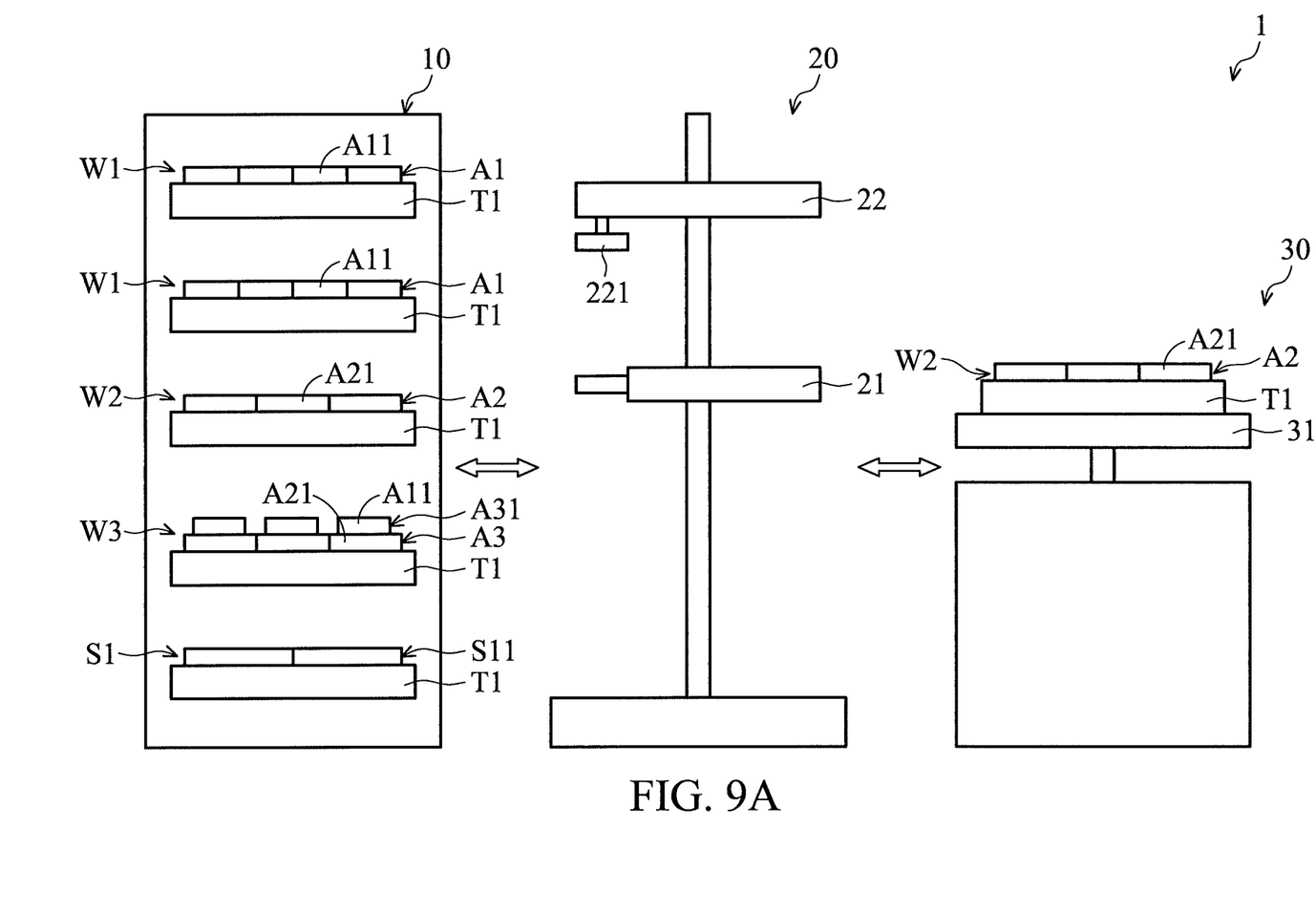
FIGS. 9A to 9C are schematic views of the die stacking apparatus during a die stacking method in accordance with some embodiments of the disclosure.

FIG. 9A is a schematic view of the die stacking apparatus 1 during the die stacking method in accordance with some embodiments of the disclosure. In step S107, the process module 40 controls the transferring device 20 to transfer the interposer wafer W2 to the carrier device 30 according to the interposer-die model code of the loaded recipe M4 or the interposer-die ID code M61 of the attaching mapping file M6.

Figure 9B:
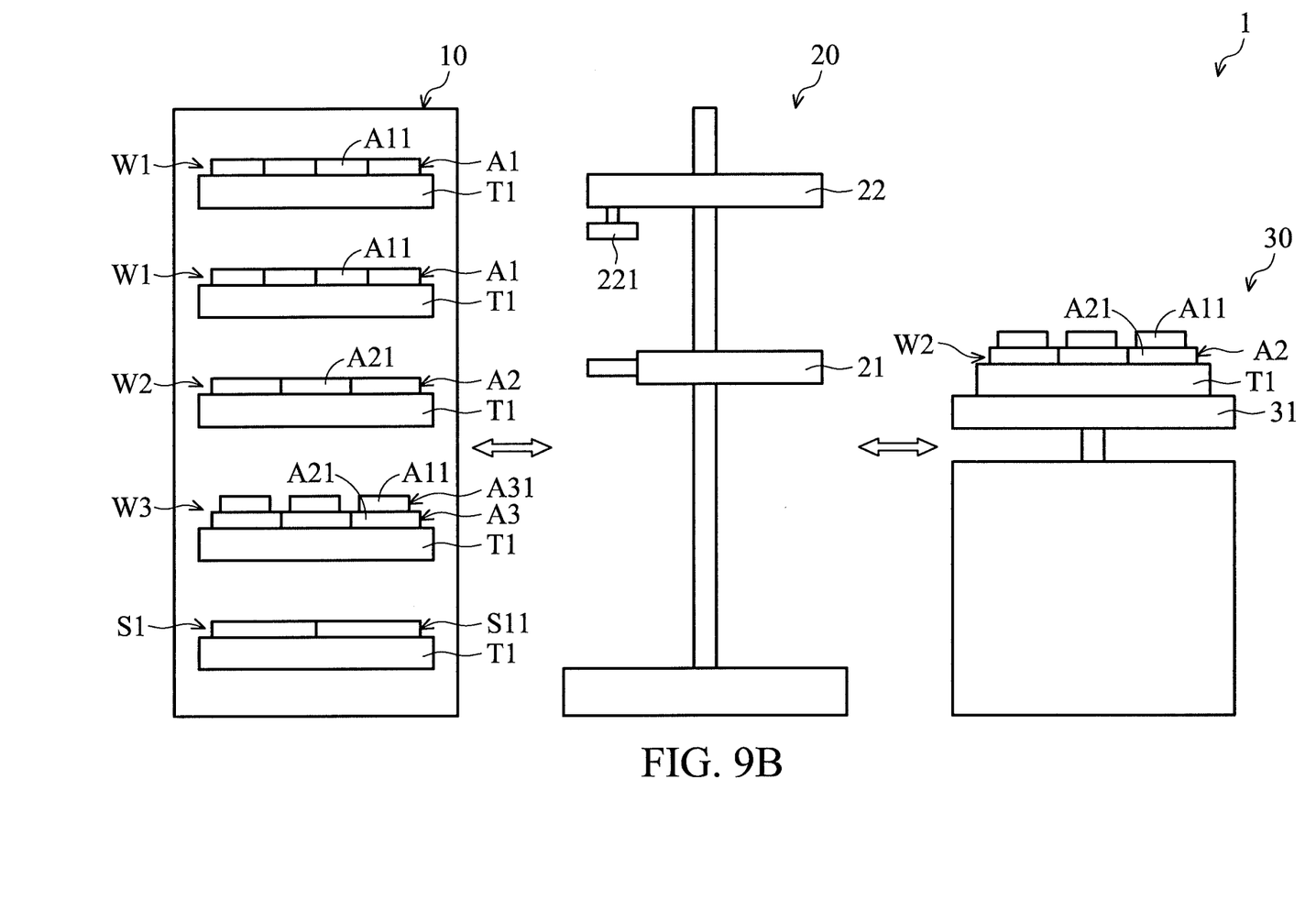

FIG. 9B is a schematic view of the die stacking apparatus 1 during a die stacking method in accordance with some embodiments of the disclosure. In step S109, the process module 40 controls the transferring device 20 to dispose a number of the top dies A11 on a number of interposer dies A21 of the interposer wafers W2 disposed on the carrier device 30 according to the attaching mapping file M6.

For example, the transferring device 20 holds one top die A11 according to the top-die ID code and the top die number of the first of the attaching data of the attaching mapping file. Afterwards, the transferring device 20 transfers the top die A11 disposed on the first of the interposer dies A21. In some embodiments, at least two top dies A11 are stacked on the interposer dies A21. The top dies A11 stacked on the interposer dies A21 may be different or the same.

In some embodiments, the interposer dies A21 include a number of workable interposer dies. When the interposer dies A21 further include one or more failed interposer dies, the process module 40 controls the transferring device 20 to dispose the top dies A11 on the workable interposer dies, excluding the failed interposer dies. Furthermore, the failed interposer dies correspond to the skip code M63. When the process module 40 reads the skip code M63 in the attaching mapping file M6, the process module 40 does not dispose any top dies on the failed interposer dies.

In some embodiments, the top die number does not correspond to any of the top die A11, which the top-die quality code M13 of the top die A11 has an unqualified-level value. The top dies A11 include a number of workable top dies, which each of the top-die quality codes M13 of the workable top dies has a qualified-level value. When the top dies includes one or more failed top dies, the process module 40 controls the transferring device 20 to dispose the workable top dies, excluding the failed top die, on the interposer dies A21.

In some embodiments, when the top dies A11 include one or more failed top dies, and interposer dies A21 include one or more failed interposer dies. The process module 40 controls the transferring device 20 to dispose the workable top dies, excluding the failed top die, on the workable interposer dies, excluding the failed interposer die.

In some embodiments, when the interposer dies A21 further include at least failed interposer die, the process module 40 controls the transferring device 20 to dispose the failed top die on the failed interposer die. In some embodiments, each of the failed interposer dies corresponds to one attaching data M62. Each of the failed top dies corresponds to one top die number of the attaching data M62.

Therefore, by the attaching mapping file, the process module 40 stacks the workable top die from the top wafer W1 on the workable interposer die of the interposer wafer W2. Therefore, the stacking process of the die stacking method is reduced to reduce operation risk and loading. Furthermore, the top dies are not to be classified before the stacking process. The manufacturing cost of 3D stacking chips is reduced through reducing the volume of the carrier usage and equipment usage.

In step S111, the process module 40 controls the transferring device 20 to transfer the interposer wafers W2 with the top dies A11 (stacked wafers W3) to the storage device 10. In some embodiments, the process module 40 controls the transferring device 20 to transfer the interposer wafer W2 with the top dies A11 (stacked wafer W3) to another storage device. After step S111, the die stacking method may return back to step S101 to stack another stacked wafer W3.

Figure 9C:
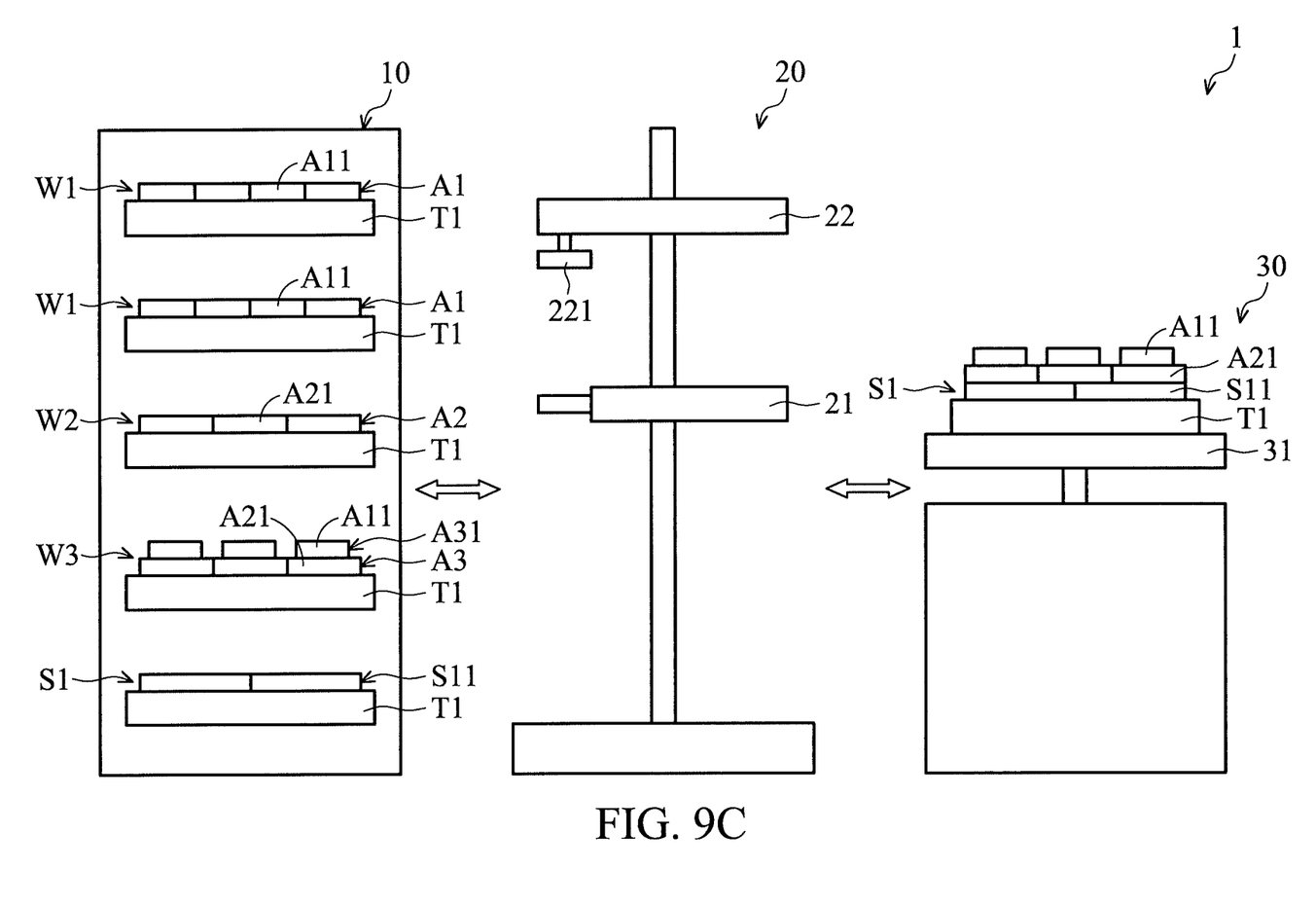

FIG. 9C is a schematic view of a die stacking apparatus 1 during a die stacking method in accordance with some embodiments of the disclosure. In step S113, the process module 40 controls the transferring device 20 to transfer the substrate array S1 to the carrier device 30. In step S115, the process module 40 controls the transferring device 20 to dispose the stacked dies A31 on the substrate array S1. The stacked die A31 stacked on the substrate S11 forms a functional chip, such as a CPU.

In some embodiments, another die stacking apparatus (not shown in figures) is provided. The steps S111 to S115 are performed in the other die stacking apparatus. In other words, the stacked wafers W3 and the substrate array S1 is contained in the other die stacking apparatus. The stacked dies A31 of the stacked wafers W3 is stacked on the substrate array S1 in the other die stacking apparatus by the die stacking method.

Figure 10:
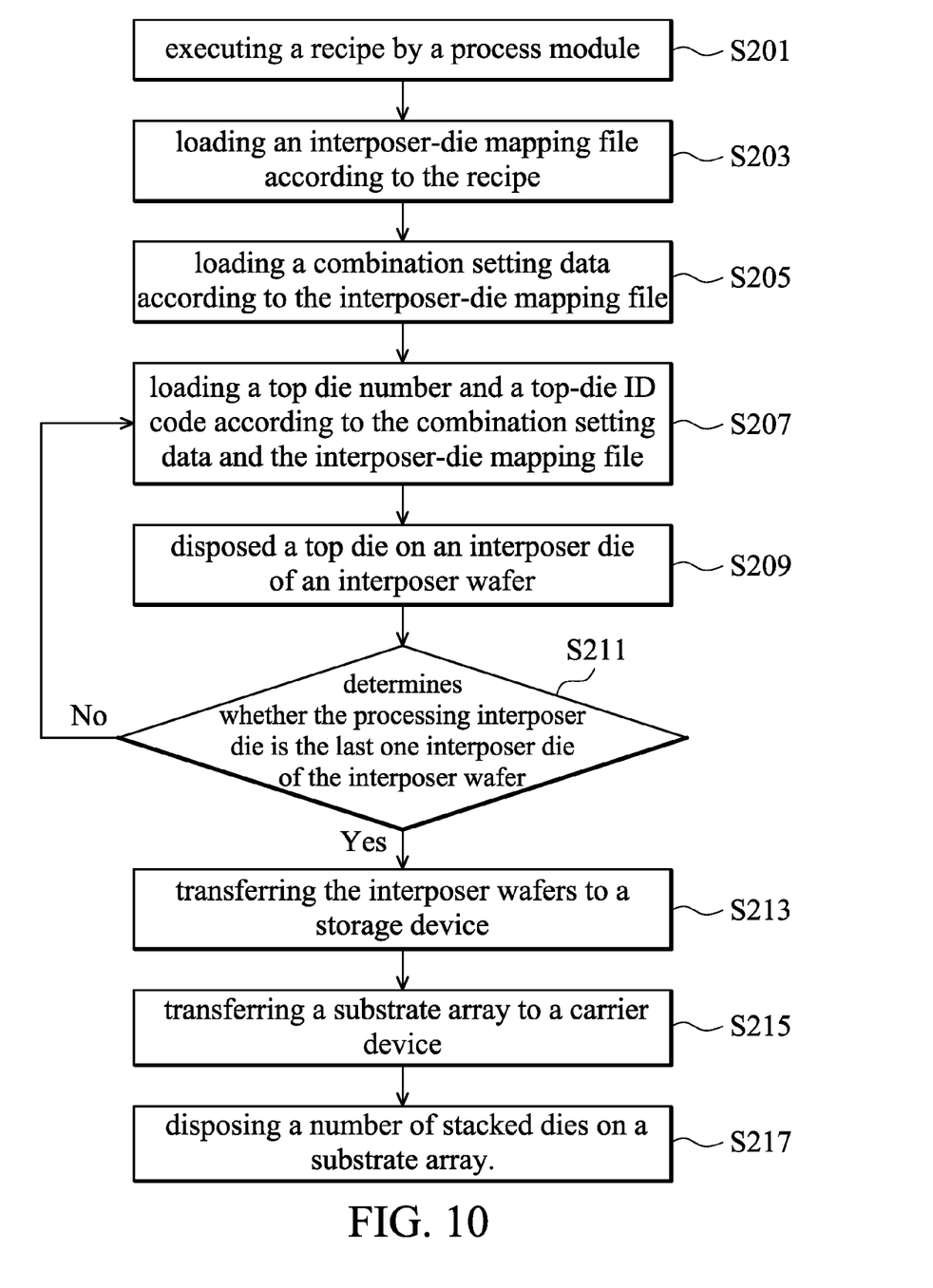
FIG. 10 is a flow chart of a die stacking method in accordance with some embodiments of the disclosure.

FIG. 10 is a flow chart of a die stacking method in accordance with some embodiments of the disclosure. The die stacking method as shown in FIG. 10 is configured to that the amount of each product is less. In step S201, the process module 40 loads one of the recipes M4 and executes the loaded recipe M4. In some embodiments, the recipe M4 excludes a combination setting data.

In step S203, the process module 40 loads one of the interposer-die mapping files M2 from the database 50 according to the interposer-die ID code of the loaded recipe M4. In some embodiments, the process module 40 controls the transferring device 20 to transfer the interposer wafer W2 to the carrier device 30 according to the interposer-die ID code M21 of the loaded interposer-die mapping file M2.

In step S205, the process module 40 loads one of the combination setting data M5 from the database 50 according to the interposer-die model code M22 of the loaded interposer-die mapping file M2. In some embodiments, the value of the interposer-die model code of the loaded combination setting data M5 is the same as the value of the interposer-die model code M22 of the loaded interposer-die mapping files M2.

In step S207, the process module 40 loads a top die number and a top-die ID code M11 from one of the top-die mapping files M1 of the database 50 according to the combination setting data M5 and the interposer-die mapping file M2.

In some embodiments, the steps of loading the top die number and the top-die ID code M11 are described as follows. The process module 40 reads one of the interposer-die quality codes M23 from the loaded interposer-die mapping file M2. Afterwards, the process module 40 reads one predetermined interposer-die quality, which has a value the same as the interposer-die quality code M23, from the loaded combination setting data M5. The process module 40 further reads the predetermined top-die quality code corresponding to the predetermined interposer-die quality.

Afterwards, the process module 40 reads one of the top-die quality codes M13, which has a value is the same as the value of the predetermined top-die quality code, from one of the top-die mapping files M1 in the database 50. The loaded top-die mapping file M1 has a top-die model code M12 having a value the same as the value of the top-die model code of the loaded combination setting data M5. Finally, the process module 40 loads the top die number and the top-die ID code M11 according to the top-die quality code M13, read by the process module 40.

In step S209, the process module 40 controls the transferring device 20 to disposes the top die A11 according to the top die number and the top-die ID code M11 on the interposer die A21 corresponding to the interposer-die quality code M23 read by the process module 40.

In step S211, the process module 40 determines whether the processing interposer die in the step 209 is the last one interposer die of the interposer wafer W2. If the processing interposer die is the last one interposer die of the interposer wafer W2, the die stacking method continues to step S213. If the processing interposer die is not the last one interposer die of the interposer wafer W2, the die stacking method returns back to step S207 and processes a next interposer die A21 of the interposer wafer W2.

In step S213, the process module 40 controls the transferring device 20 to transfer the interposer wafers W2 with the top dies A11 (stacked wafers W3) to the storage device 10. After step S213, the die stacking method may return back to step S201 to stack another stacked wafer W3.

In step S215, the process module 40 controls the transferring device 20 to transfer the substrate array S1 to the carrier device 30. In step S217, the process module 40 controls the transferring device 20 to dispose the stacked dies A31 on the substrate array S1. The stacked die A31 stacked on the substrate S11 forms a functional chip, such as a CPU.

Embodiments of a die stacking apparatus and method are provided. A top die is picked up from a top die wafer, and disposed on an interposer die of an interposer die wafer. The unworkable top die and interposer die are skipped during the stacking process. The top dies are not to be classified before the stacking process. Therefore, the stacking process is reduced to reduce operation risk and loading. Furthermore, the manufacturing cost of 3D stacking chips is reduced through reducing the volume of the carrier usage and equipment usage.

In some embodiments, a die stacking apparatus is provided. The die stacking apparatus includes a storage device configured to contain a top wafer and an interposer wafer. The top wafer has a number of top dies, and the interposer wafer has a number of interposer dies. The die stacking apparatus also includes a carrier device configured to carry the interposer wafer, and a transferring device configured to transfer the interposer wafer to the carrier device and to dispose the top dies on the interposer dies. The die stacking apparatus further includes a process module configured to control the transferring device. The process module controls the transferring device to transfer the interposer wafer to the carrier device, and controls the transferring device to dispose the top dies on the interposer dies of the interposer wafer, which is stacked on the carrier device.

In some embodiments, a die stacking method is provided. The die stacking method includes executing a recipe having a combination setting data by a process module and loading an interposer-die mapping file and a top-die mapping file according to the recipe by the process module. The interposer-die mapping file corresponds to an interposer wafer, and the top-die mapping file corresponds to a top wafer. The die stacking method also includes generating an attaching mapping file according to the combination setting data, the interposer-die mapping file, and the top-die mapping file and transferring the interposer wafer to a carrier device by a transferring device. The die stacking method further includes disposing a number of top dies of the top wafer on a number of interposer dies of the interposer wafer according to the attaching mapping file.

In some embodiments, a die stacking method is provided. The die stacking method includes executing a recipe by a process module and loading an interposer-die mapping file according to the recipe. The interposer-die mapping file corresponds to an interposer wafer including a plurality of interposer dies. The die stacking method also includes loading a combination setting data according to the interposer-die mapping file and loading a top die number and a top-die ID code of a top-die mapping file according to the combination setting data and the interposer-die mapping file.

The top-die ID code corresponds to a top wafer W1, and the top die number corresponds to one of a plurality of top dies of the top wafers W1. The die stacking method further includes disposing the one of the top die of the top wafer on one of the interposer dies of the interposer wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   executing, by a computer, a manufacturing recipe having a combination setting data including a plurality of settings defining combinations of top dies and interposer dies;
   loading an interposer-die mapping file and a top-die mapping file according to the manufacturing recipe by the computer, wherein the interposer-die mapping file corresponds to an interposer wafer, and the top-die mapping file corresponds to a top wafer;
   generating an top-die-interposer-die attaching mapping file according to the combination setting data, the interposer-die mapping file, and the top-die mapping file;
   transferring the interposer wafer to a carrier device by a transferring device; and
   disposing a plurality of top dies of the top wafer on a plurality of interposer dies of the interposer wafer according to the top-die-interposer-die attaching mapping file.

2. The method as claimed in claim 1, wherein the top-die mapping file includes a plurality of top-die quality codes corresponding each of the top dies, the interposer-die mapping file includes a plurality of interposer-die quality codes corresponding each of the interposer dies, and the combination setting data includes the plurality of settings defining the combinations of the top dies and the interposer dies according the top-die quality codes and the interposer-die quality codes.

3. The method as claimed in claim 2, further comprising generating the top-die-interposer-die attaching mapping file according to the top-die quality codes, the interposer-die quality codes and the combination settings.

4. The method as claimed in claim 1, wherein the top dies includes a plurality of workable top dies, wherein when the top dies further includes a failed top die, the computer controls the transferring device to dispose the workable top dies, excluding the failed top die, on the interposer dies.

5. The method as claimed in claim 1, wherein the interposer dies includes a plurality of workable interposer dies, wherein when the interposer dies further includes a failed interposer die, the computer controls the transferring device to dispose the top dies on the workable interposer dies, excluding the failed interposer die.

6. The method as claimed in claim 1, wherein the top dies includes a plurality of workable top dies, and the interposer dies includes a plurality of workable interposer dies, wherein when the top dies further includes a failed top die and the interposer dies further includes a failed interposer die, the computer controls the transferring device to dispose the workable top dies, excluding the failed top die, on the workable interposer dies, excluding the failed interposer die.

7. A method, comprising:
  executing, by a computer, a manufacturing recipe having a combination setting data including a plurality of settings defining combinations of top dies and interposer dies;
  loading an interposer-die mapping file and a top-die mapping file according to the manufacturing recipe by the computer, wherein the interposer-die mapping file corresponds to an interposer wafer, and the top-die mapping file corresponds to a top wafer;
  generating an top-die-interposer-die attaching mapping file according to the combination setting data, the interposer-die mapping file, and the top-die mapping file;
  transferring the interposer wafer to a carrier device by a transferring device; and
  disposing a plurality of top dies of the top wafer on a plurality of interposer dies of the interposer wafer according to the top-die-interposer-die attaching mapping file,
  wherein both of the manufacturing recipe and the interposer-die mapping file have an interposer-die model code, and values of the interposer-die model codes are the same.

8. The method as claimed in claim 7, wherein the interposer-die model code of the manufacturing recipe corresponds to a type of the interposer dies.

9. The method as claimed in claim 7, wherein the manufacturing recipe corresponds to a semiconductor product.

10. The method as claimed in claim 7, wherein both of the top-die-interposer-die attaching mapping file and the interposer-die mapping file have an interposer-die ID code, and values of the interposer-die ID codes are the same.

11. The method as claimed in claim 10, wherein the interposer-die ID code corresponds to a type of the interposer wafer.

12. The method as claimed in claim 7, wherein the top-die-interposer-die attaching mapping file has a plurality of the top-die-interposer-die attaching data, and each of the top-die-interposer-die attaching data corresponds to one of the interposer dies, which corresponds to the interposer-die mapping file.

13. The method as claimed in claim 12, wherein all of the top-die-interposer-die attaching data and the top-die mapping file have a top-die ID code, and values of the top-die ID codes of the top-die-interposer-die attaching data and the top-die mapping file are the same.

14. A method, comprising:
  executing, by a computer, a manufacturing recipe having a combination setting data including a plurality of settings defining combinations of top dies and interposer dies;
  loading an interposer-die mapping file and a top-die mapping file according to the manufacturing recipe by the computer, wherein the interposer-die mapping file corresponds to an interposer wafer comprising a plurality of workable interposer dies, the top-die mapping file corresponds to a top wafer comprising a plurality of workable top dies;
  generating an top-die-interposer-die attaching mapping file according to the combination setting data, the interposer-die mapping file, and the top-die mapping file;
  transferring the interposer wafer to a carrier device by a transferring device; and
  disposing the workable top dies on the workable interposer dies according to the top-die-interposer-die attaching mapping file.

15. The method as claimed in claim 14, wherein both of the manufacturing recipe and the interposer-die mapping file have a top-die model code, and values of the top-die model codes are the same.

16. The method as claimed in claim 15, wherein the top-die model code of the manufacturing recipe corresponds to a type of the top dies.

17. The method as claimed in claim 14, wherein both of the manufacturing recipe and the interposer-die mapping file have an interposer-die model code, and values of the interposer-die model codes are the same.

18. The method as claimed in claim 17, wherein the interposer-die model code of the manufacturing recipe corresponds to a type of the interposer dies.

19. The method as claimed in claim 14, wherein the manufacturing recipe corresponds to a semiconductor product.

20. The method as claimed in claim 14, wherein both of the top-die-interposer-die attaching mapping file and the interposer-die mapping file have an interposer-die ID code, and values of the interposer-die ID codes are the same, wherein the interposer-die ID code corresponds to a type of the interposer wafer.

* * * * *